United States Patent
Matthey

(10) Patent No.: US 7,631,164 B2
(45) Date of Patent: Dec. 8, 2009

(54) MODULO ARITHMETIC

(75) Inventor: Marc Matthey, Neuchâtel (CH)

(73) Assignee: Emma Mixed Signal C.V., Amsterdam (NL)

(*) Notice: Subject to any disclaimer, the term of this patent is extended or adjusted under 35 U.S.C. 154(b) by 170 days.

(21) Appl. No.: 11/488,663

(22) Filed: Jul. 19, 2006

(65) Prior Publication Data

US 2007/0174585 A1 Jul. 26, 2007

(30) Foreign Application Priority Data

Jul. 19, 2005 (EP) .................... 05405444

(51) Int. Cl.
*G06F 12/00* (2006.01)

(52) U.S. Cl. .................... 711/219

(58) Field of Classification Search ............ None
See application file for complete search history.

(56) References Cited

U.S. PATENT DOCUMENTS

| | | | | |
|---|---|---|---|---|
| 4,800,524 A | * | 1/1989 | Roesgen | 711/217 |
| 4,809,156 A | * | 2/1989 | Taber | 711/217 |
| 5,381,360 A | * | 1/1995 | Shridhar et al. | 708/491 |
| 5,659,700 A | * | 8/1997 | Chen et al. | 711/217 |
| 5,918,252 A | | 6/1999 | Chen et al. | |
| 6,047,364 A | * | 4/2000 | Kolagotla et al. | 711/217 |
| 6,049,858 A | * | 4/2000 | Kolagotla et al. | 711/217 |
| 6,052,768 A | * | 4/2000 | Rim | 711/217 |
| 6,397,318 B1 | * | 5/2002 | Peh | 711/220 |
| 6,647,484 B1 | | 11/2003 | Jiang et al. | |
| 6,760,830 B2 | * | 7/2004 | Inoue et al. | 711/220 |

FOREIGN PATENT DOCUMENTS

| | | |
|---|---|---|
| DE | 197 48 547 A1 | 7/1998 |
| WO | WO-02/054227 A1 | 7/2002 |

* cited by examiner

*Primary Examiner*—Hiep T Nguyen
(74) *Attorney, Agent, or Firm*—Birch, Stewart, Kolasch & Birch, LLP

(57) ABSTRACT

A modulo arithmetic (61) for generating the addresses for accessing the memory cells of a memory in a DSP (digital signal processor) includes three inputs: an input address (30), an increment (31) and a modulo value (33). The next address (36) is generated based on these inputs as follows. An adder (22) generates a first address (32) by adding the input address (30) and the increment (31) and a second address (34) is generated by subtracting the modulo (33) from the first address (32) by means of the subtractor (23). The comparator (45) checks whether the second address is lower than or equal to zero and if so, the multiplexer (24) outputs the first address at its output (36). If the second address is higher than zero, the multiplexer (24) is controlled such that it outputs the second address (34). A further comparator (63) compares the input address (30) and the modulo (33). If the input address (30) is different from the modulo (33), the multiplexer (64) generates the next output address (66) by selecting the output (36) of the multiplexer (24) and if the input address (30) is equal to the modulo (33) the multiplexer (64) generates the next output address (66) by selecting the constant value "0" (67) inputted at a second input of the multiplexer (64). This modulo arithmetic allows to directly and repeatedly access the elements of a matrix stored in a digital memory row by row in a direction of its columns.

13 Claims, 6 Drawing Sheets

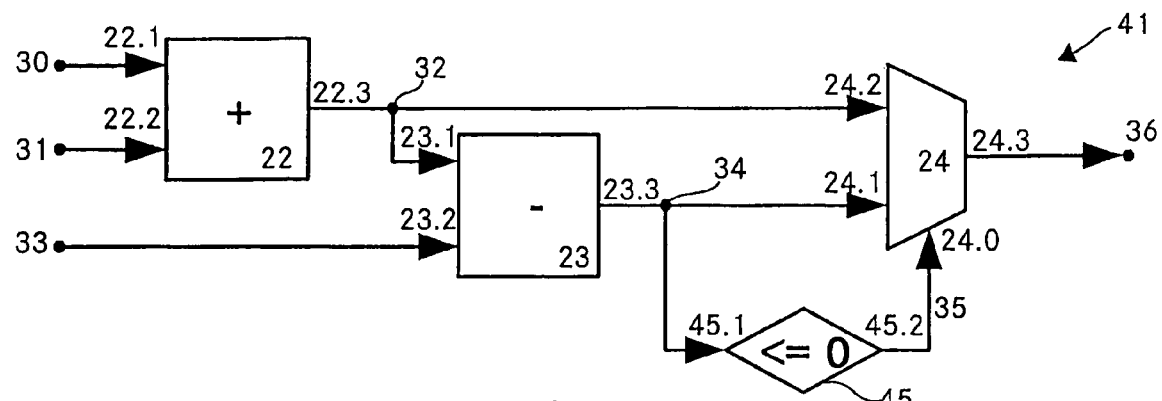
Fig. 6
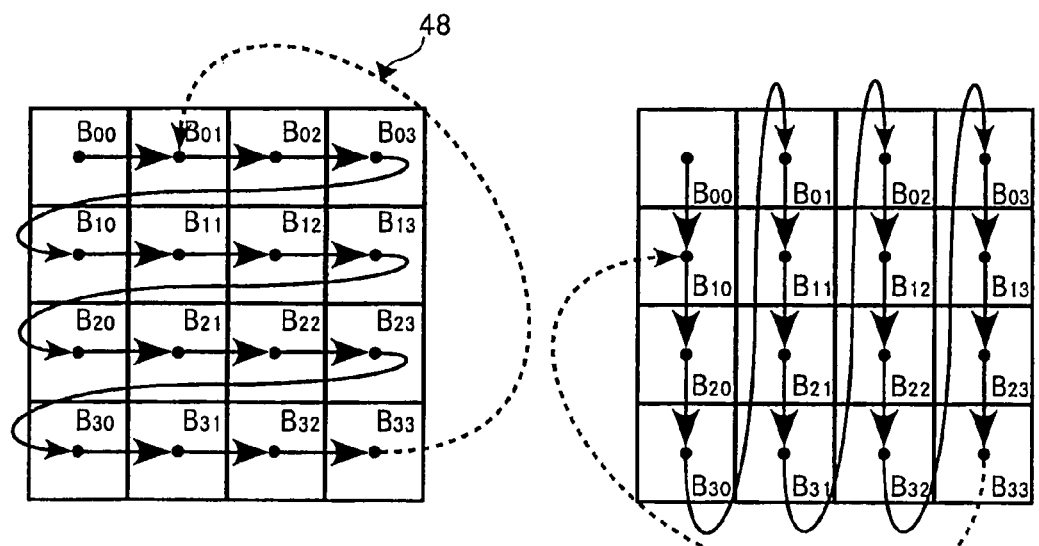
Fig. 7
Fig. 8

MODULO ARITHMETIC

TECHNICAL FIELD

The invention relates to a device for generating an output address for addressing a memory cell of a digital memory including an adder adapted to generate a first address by adding an increment to an input address, a subtractor adapted to generate a second address by subtracting a modulo from said first address and a first multiplexer adapted to generate a third address by selecting said first or said second address in dependency of said second address. The invention further relates to an integrated circuit including such a device, a listening device including such an integrated circuit and a method for generating an output address for addressing a memory cell of a digital memory including generating a first address by adding an increment to an input address, generating a second address by subtracting a modulo from said first address and generating a third address by selecting said first or said second address in dependency of said second address.

BACKGROUND ART

Many electronic devices process digital signals. Often, this is done by means of a microprocessor such as for example a digital signal processor (DSP) which is particularly suited for processing digital signals such as audio or video signals. For example, in the processing of voice signals it is often required that not only a single number has to be handled but that matrix calculations have to be performed. The elements of a matrix are typically stored in a digital memory sequentially, that is each element is stored in a single memory cell one after the other and row by row. In order to perform the necessary calculations, the processor has to read the values from the memory cells. For this purpose, a DSP typically includes an address generation unit that generates the addresses for an efficient access to the content of the corresponding memory cells. For an efficient access these address generation units often include a modulo arithmetic.

Some calculations require that the elements of a matrix are read linearly that is one after the other row by row. FIG. 1 shows a part of a known address generation unit (AGU) 21 that allows to efficiently generating the addresses for linearly addressing the elements of a matrix.

The AGU 21, designated hereinafter as the "standard modulo", includes an adder 22 that adds the increment 31 inputted at a second input 22.2 of the adder 22 to the current address, designated hereinafter the input address 30, inputted at the first input 22.1 of the adder 22. At its output 22.3, the adder 22 produces the next address 32 that is inputted to a first input 23.1 of a subtractor 23. A modulo 33 is inputted to a second input 23.2 of the subtractor 23 which outputs a comparison address 34 at its output 23.3. The next address 32 is further inputted at the first input 24.1 of a multiplexer MUX 24 and the comparison address 34 is inputted at the second input 24.2 of the multiplexer MUX 24. Depending on the value of the comparison address 34, the MUX 24 generates the output address 36 at its output 24.3. That is, the MUX 24 provides the next address 32 as the output address 36 if the comparison address 34 is lower than zero and the MUX 24 provides the comparison address 34 as the output address 36 if the comparison address 34 is higher than or equal to zero. For deciding whether the comparison address 34 is lower than zero the AGU 21 includes a comparator 25 where the output 23.3 of the subtractor 23 is connected to the input 25.1 of the comparator 25. The comparator 25 generates a control signal 35 at its output 25.2 for controlling the MUX 24 via its control input 24.0. Starting with a given starting address, repeating the address generation with the AGU 21 several times and using the generated output address 36 as the input address 30 of the next address generation respectively, AGU 21 generates an address sequence for addressing the cells of a matrix.

It is to note that this modulo arithmetic is a simple version. Correct results are only available if the input address is lower than the modulo and if the increment is positive and lower than the modulo.

Storing a n*m with n=4 and m=4 matrix B with the sixteen elements $B_{00}, B_{01}, B_{02}, B_{03}, B_{10}, B_{11}, B_{12}, B_{13}, B_{20}, B_{21}, B_{22}, B_{23}, B_{30}, B_{31}, B_{32}$ and $B_{33}$ as shown in FIG. 13 requires for example sixteen memory cells 0-15 as shown in FIG. 2. Starting with the values 0 as the input address 30, 1 as the increment 31 and 16 as the modulo 33, AGU 21 produces the following address sequence:

0 1 2 3 4 5 6 7 8 9 10 11 12 13 14 15 0 1     (I)

which means that all elements of the matrix B are addressed linearly. This is shown in FIGS. 2 and 3 by the arrows where each arrow starts at the input address and points to the corresponding output address generated by AGU 21. FIG. 3 shows how the elements of the matrix B are accessed in sequence. And it can be seen that the addressing algorithm jumps from the last matrix element 15 back to the first element 0 as indicated by the arrow 38 (circular buffer).

However, certain matrix calculations such as for example a multiplication of a p*n with p=2 and n=4 matrix A with the eight elements $A_{00}, A_{01}, A_{02}, A_{03}, A_{10}, A_{11}, A_{12}$ and $A_{13}$ as shown in FIG. 13 with the n*m matrix B with n=4 and m=4 require that the elements of the matrix B are accessed column by column. Multiplying A with B yields the p*n product matrix C=A×B with the elements $C_{00}, C_{01}, C_{02}, C_{03}, C_{10}, C_{11}, C_{12}$ and $C_{13}$. The following equation shows how the elements $C_{ij}$ are determined:

$$C_{ij} = \sum_{k=0}^{n-1} A_{ik} \cdot B_{kj} \qquad (II)$$

That is, the element $C_{ij}$ is nothing else than the scalar product of the $i^{th}$ row vector $A_i$ of A with the $j^{th}$ column vector $B_j$ of B. The elements of the row vector $A_i$ are addressed with a standard modulo AGU as for example AGU 21. But the addressing of the elements of the column vector $B_j$ is more complex and is not realisable with the AGU 21: Starting for example again with a value 0 for the input address 30, n (n=number of rows of B=4) as the increment 31 and n*m−1=15 (n=number of rows of B=4 and m=number of columns of B=4) as the modulo 33, AGU 21 produces the following address sequence:

0 4 8 12 1 5 9 13 2 6 10 14 3 7 11 0 4 8     (III)

Again, the arrows in FIG. 4 show the sequence how the memory cells are addressed and FIG. 5 shows the corresponding sequence of the accessed matrix elements. It can be seen that with the modulo n*m−1 the AGU 21 does not allow to efficiently access the $16^{th}$ memory cell with the element $B_{33}$ but jumps from the element $B_{23}$ back to the element $B_{00}$. Accordingly, there are needed some extra cycles to access the last element $B_{33}$ of B.

A further addressing possibility with the AGU 21 is to choose n*m=16 as the value of the modulo 33. In this case AGU 21 produces the address sequence:

0 4 8 12 0 4 8 12 0 4 8 12 0 4 8 12 0 4     (IV)

In order to address the elements correctly, the address pointer has to be incremented by 1 after each column (after n addresses) which would yield the correct address sequence:

$$0\ 4\ 8\ 12\quad \underset{=0+1}{1}\quad 5\ 9\ 13\quad \underset{=1+1}{2}\quad 6\ 10\ 14\quad \underset{=2+1}{3}\quad 7\ 11\ 15\quad \underset{\underset{\text{mod }16}{=(15+1)}}{0}\quad 4\ \ldots \qquad (V)$$

But for adding 1 after each column there are also needed some extra computing cycles to jump to the next column.

The known address generation unit does not allow to efficiently address a matrix by its columns. Additional effort is necessary to generate the address sequence for accessing the elements of a matrix column by column.

Document U.S. Pat. No. 4,809,156 discloses an address generation unit for a computer system that includes a plurality of address generation files each of which being designed for a specific address generation problem. One of these problems is to address a matrix column by column. This circuit allows the generation of the required addressing sequence (as described for example in col. 11, line 30 ff). However, the address generation unit is very complex and requires a lot of space on a chip or even a separate chip. Accordingly, for generating the required address sequences a complicated programming is necessary.

Document U.S. Pat. No. 6,052,768 shows a further address generation circuit. Here, an incremented address is generated by adding an increment to a current address and a revised address is generated by adding or subtracting (depending on the sign of the increment) a data region size value to or from the incremented address. The output address is then generated by selecting either the incremented address or the revised address by means of an output selection circuit which includes two multiplexers, a comparator and an XOR gate. Again, this circuit requires a large area on a chip. Again, a large substrate area is necessary to implement this circuit and it is not possible to generate the addresses for accessing a matrix column by column.

Another addressing circuit that allows accessing the elements of a matrix column by column is known from document U.S. Pat. No. 6,647,484 B1. For generating the addresses, the circuit includes three adders and a subtractor and therefore also requires a large chip area.

SUMMARY OF THE INVENTION

It is the object of the invention to create a device and a method pertaining to the technical field initially mentioned that allow to efficiently generating the address sequence for accessing the elements of a matrix column by column where the matrix is stored in a memory row by row with reduced implementation complexity.

The solution of the invention is specified by the features of claim 1. The device for generating an output address for addressing a memory cell of a digital memory includes an adder for generating a first address by adding an increment to an input address, a subtractor for generating a second address by subtracting a modulo from said first address and a first multiplexer for generating a third address by selecting either the first or the second address in dependency of the value of the second address. According to the invention the first multiplexer is adapted to select the first address as the output address if the second address is lower than or equal to zero and the first multiplexer is adapted to select the second address as the output address if the second address is higher than zero.

The address generation unit according to the invention, designated hereinafter the "special modulo", differs from the above mentioned "standard modulo" only in that the test condition of the second address is modified. Now the device not only checks whether the second address is lower than zero but it also checks whether the second address is equal to zero. In both cases the first multiplexer selects the first address as the output address.

In the example shown above and starting with an input address 0, an increment 4 and a modulo 15 the device according to the invention produces the address sequence:

$$0\ 4\ 8\ 12\ 1\ 5\ 9\ 13\ 2\ 6\ 10\ 14\ 3\ 7\ 11\ 15\ 4\ 8 \qquad (VI)$$

As can be seen, the inventive address generation unit produces the correct address sequence for addressing all elements of a matrix column by column—including direct addressing of the last matrix element.

That is, the address generation unit is improved for addressing matrices column by column with only a minimum additional effort such as for example minimum additional hardware resources or minimum additional programming.

Again it is to note that this modulo arithmetic has the limitation that the input address has to be lower than the modulo and that the increment has to be positive and lower than the modulo. However, an address generation unit with the inventive device is sufficient in the majority of cases.

The device according to the invention has the further drawback that at the end of the addressing, the address pointer does not jump back to the first memory cell, but to the fifth memory cell. Accordingly, if the elements of the same or a different matrix shall be addressed column by column more than once—such as for example when two matrices are multiplied—it is necessary to re-initialise the address pointer to zero each time when it has reached the last matrix element.

In order to avoid this re-initialisation the device includes in a preferred embodiment of the invention a second multiplexer. This second multiplexer generates the output address in dependency of the value of the input address and the modulo. That is depending on the values of the input address and the modulo the second multiplexer selects either the third address or a constant fourth address as the output address. With this modification it is possible to check whether the input address corresponds to the last matrix element and if so it is possible to generate the correct output address. This device is designated hereinafter as the "special modulo with auto-reset".

For checking whether the input address corresponds to the last matrix element the device further includes a second comparator. This second comparator serves for deciding whether the input address is equal to or different from the modulo. The corresponding dependency of the output address generation by the second multiplexer then is preferably as follows: if the input address is different from the modulo the second multiplexer selects the third address as the output address and if the input address is equal to the modulo the second multiplexer selects the constant fourth address as the output address.

The value of the constant fourth address is advantageously zero which means that the second multiplexer generates the output address by selecting the value zero if the input address is equal to the modulo. Accordingly, the "special modulo with auto-reset" generates the output address zero if the input address is equal to the modulo and it selects the third address as the output address if the input address is different from the modulo.

Another preferred embodiment of the invention provides a combination of the "standard modulo" and the "special modulo". By inputting a specific value at a further input of the device it can be chosen whether the device shall generate the output address according to the "standard modulo" or according to the "special modulo". Preferably, by inputting a value of a first given set of values at the further input, the device works in the "standard modulo" mode and by inputting a value of a second given set of values at the further input, the device works in the "special modulo" mode where the first and the second given sets include distinct sets of values. Preferably, the first given set of values includes the value of zero and the second given set of values includes the value of one. And even more preferably, the first given set of values includes exclusively the value of zero and the second given set of values includes exclusively the value of one.

Accordingly, in the "standard modulo" mode the device is adapted to generate the output address by selecting the first address as the output address if the second address is lower than zero and by selecting the second address as the output address if said second address is higher than or equal to zero. In the "special modulo" mode, the device is adapted to generate the output address by selecting the first address as the output address if the second address is lower than or equal to zero and by selecting the second address as the output address if the second address is higher than zero.

In a further preferred embodiment of the invention the combination of the "standard modulo" and the "special modulo" further provides the auto-reset feature.

That is, the "standard modulo" mode is the same as in the combination without auto-reset. But in the "special modulo" mode the device is adapted to generate the output address by
  selecting the first address as the output address if the second address is lower than or equal to zero and if the input address is different from the modulo,
  selecting the second address as the output address if the second address is higher than zero and if the input address is different from the modulo and
  selecting the constant fourth address as the output address if the input address is equal to the modulo.

An address generation unit as described above is typically realised as hardware, that is by means of an electronic circuit. In a preferred embodiment the device is implemented as a part of an integrated circuit, particularly an integrated circuit of a digital signal processor (DSP). It is possible to implement the invention by means of discrete interconnected components. Nevertheless, the invention can not only be implemented as hardware, but also in software or any combinations of these two possibilities.

Generally, the invention is applicable in any device where information stored in a digital memory in form of matrix has to be accessed column by column. This is typically the case in a DSP. According DSP operations are for example: speech encoding and decoding, speech encryption and decryption, speech recognition, speech synthesis, speaker identification, Hi-fi audio encoding and decoding, modem algorithms, noise cancellation, audio equalization, ambient acoustics emulation, audio mixing and editing, sound synthesis, vision, image compression and decompression, image composition, beamforming, echo cancellation or spectral estimation. The corresponding applications are for example: digital cellular phones, personal communications systems, multimedia computers, secure communication, user interfaces, multimedia computers, robotics, automotive applications, security systems, consumer audio & video, digital audio broadcast, professional audio, digital signalling on cable TV, wireless computing, navigation, data/fax modems, secure communications, industrial applications, advanced vehicular audio, music, digital photography, digital video, video-over-voice, consumer video, medical imaging, radar/sonar, Speakerphones, modems, telephone switches and others.

However, one of the most preferred applications of the invention are listening devices that include an integrated circuit as described before. For processing the digitised audio signals a listening device, for example a hearing aid, typically includes a DSP that performs the required signal processing. Often this processing includes matrix multiplication where the matrices have to be addressed by its columns as described above.

The solution of the invention regarding the method pertaining to the technical field initially mentioned is specified by the features of claim 12. According to the invention, the method includes selecting the first address as the output address if the second address is lower than or equal to zero and selecting the second address as the output address if the second address is higher than zero.

As shown in (VI) and described before, the invention allows to efficiently generate the address sequence for accessing all elements of a matrix column by column even though the matrix is stored row by row.

Preferably, generating the output address includes selecting the third address if the input address is different from the modulo and selecting the constant fourth address if the input address is equal to the modulo.

As already mentioned, this method is used for generating an output address for accessing a single memory cell of a digital memory based on an input address, an increment and a modulo. In order to access two or more elements of a matrix stored in the digital memory one after the other in a direction of its columns, the method is preferably executed at least twice and the output address of the $n^{th}$ execution is used as the input address of the $(n+1)^{th}$ execution.

Other advantageous embodiments and combinations of features come out from the detailed description below and the entirety of the claims.

BRIEF DESCRIPTION OF THE DRAWINGS

The drawings used to explain the embodiments show:

FIG. 6 a modulo arithmetic according to the invention;

FIG. 7 the addressing order for linear addressing of the elements of the matrix of FIG. 3 with the modulo arithmetic of FIG. 6;

FIG. 8 the addressing order for column by column addressing of the elements of the matrix of FIG. 3 with the modulo arithmetic of FIG. 6;

In the figures, the same components are given the same reference symbols.

PREFERRED EMBODIMENTS

An address generation unit of a DSP typically uses four dedicated registers to generate an address for accessing the content of a specific memory cell: a pointer register, a modulo register, an increment register and an offset register. The generated address typically is:

$$\text{address} = \text{pointer} + \text{offset} \quad (VII)$$

In other words, the new address is determined from the current pointer value by adding an offset. At the same time as the new pointer value is determined, the pointer is updated for the next cycle:

$$\text{new pointer} = (\text{old pointer} + \text{increment}) \% \text{ modulo} \quad (VIII)$$

where the sign "%" stands for the "modulo"-operation.

The invention only relates to the part that updates the pointer value (according to equation VIII). Hence, for reasons of comprehension and simplicity, no offset value is added to the pointer value to generate the new address. Accordingly, in the following description the address value and the pointer value refer to the same value.

Figure 1:
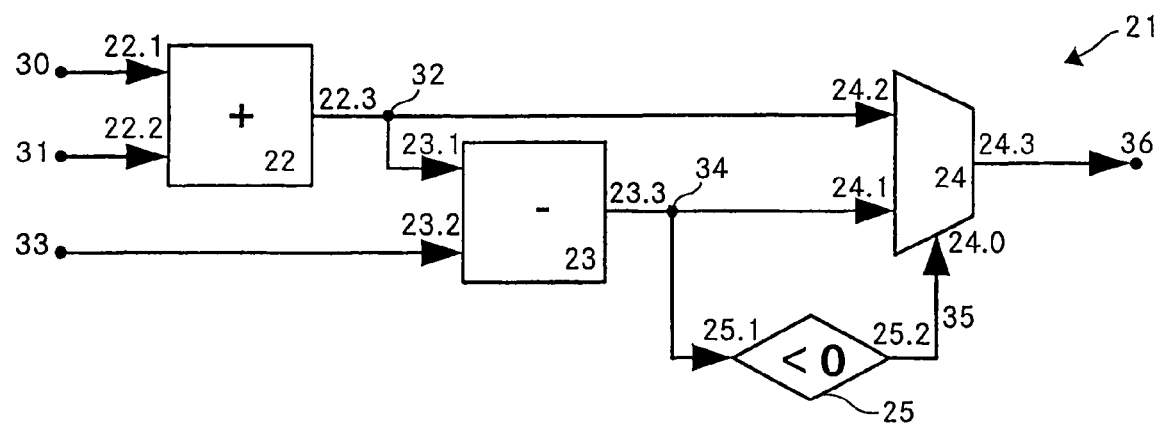
FIG. 1 A modulo arithmetic according to the prior art.
Figure 2:
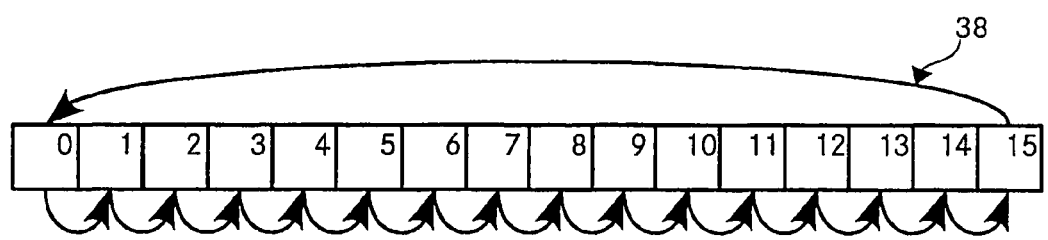
FIG. 2 the addressing order for linear addressing of memory cells with the modulo arithmetic of FIG. 1.
Figure 3:
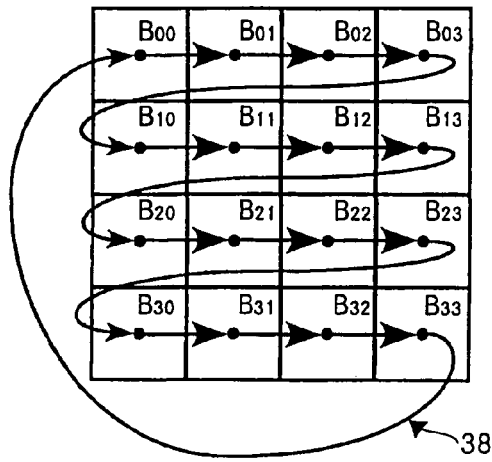
FIG. 3 the addressing order for linear addressing of the elements of a matrix with the modulo arithmetic of FIG. 1.
Figure 5:
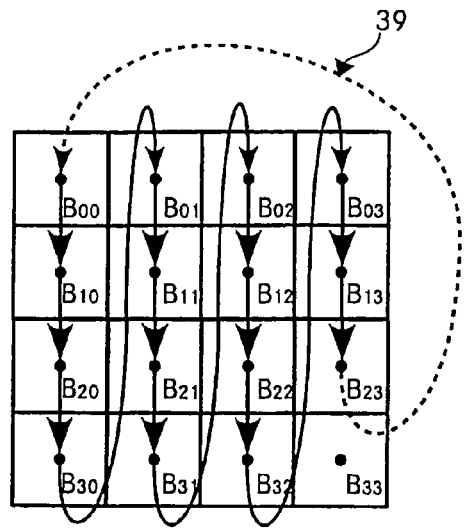
FIG. 5 the addressing order for column by column addressing of the matrix of FIG. 3 with the modulo arithmetic of FIG. 1.
Figure 4:
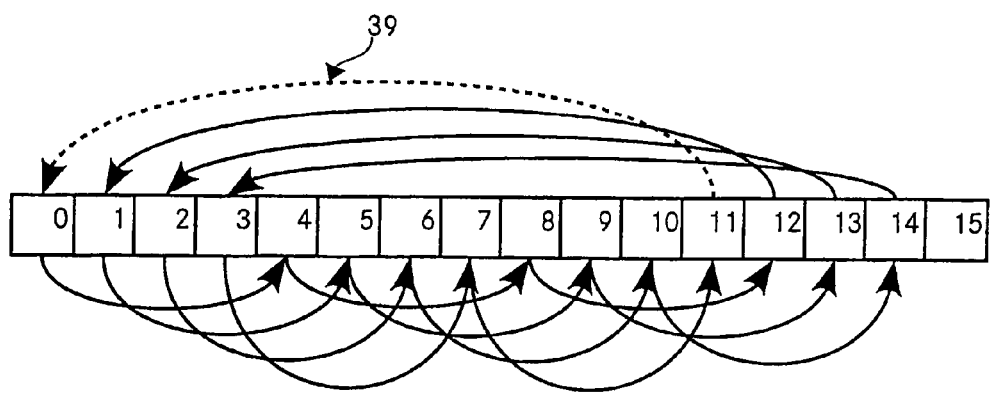
FIG. 4 the addressing order for column by column addressing of memory cells with the modulo arithmetic of FIG. 1.

FIG. 1 shows an address generation unit AGU 21 for generating addresses for accessing memory cells of a digital memory, for example the elements of a matrix stored in a data register. As described before, AGU 21 allows to linearly address all elements of a n*m matrix (n rows, m columns) that is stored in the digital memory line by line. But it is not possible with the AGU 21 to directly access all elements of this matrix column by column. The last element of the matrix, that is the (n*m)$^{th}$ element can not be addressed directly. This is because in the last step the AGU 21 generates zero as the output address 36 and therefore jumps back to the first element of the matrix instead of to the last element as shown in FIG. 5 by the dotted arrow 39.

This means that the last matrix element has to be addressed separately by changing the value of the pointer (or the modulo or the increment). This however results in additional cycles and requires more time.

FIG. 6 shows the modulo arithmetic according to the invention. The AGU 41 is very similar to the AGU 21 as shown in FIG. 1. The only difference is the condition for testing the comparison address 34. Unlike comparator 25 that tests whether the comparison address 34 is lower than zero, the comparator 45 tests whether the comparison address 34 is lower than or equal to zero. Accordingly, MUX 24 selects the next address 32 as the output address 36 if the comparison address 34 is lower than or equal to zero and MUX 24 selects the comparison address as the output address 36 if the comparison address 34 is higher than zero.

FIG. 7 shows the corresponding addressing order of the elements of the n*m matrix B with n=4 and m=4 for linear addressing with the value 0 as the starting input address 30, value 1 as the increment 31 and value 15 as the modulo 33. It is to note that all sixteen matrix elements are addressed correctly, but that after the last matrix element $B_{33}$ the addressing algorithm does not jump back to the first matrix element $B_{00}$, but to the second matrix element $B_{01}$ which is shown by arrow 48.

FIG. 8 shows the corresponding addressing order of the elements of the n*m matrix B with n=4 and m=4 for column by column addressing with the value 0 as the starting input address 30, value 4 as the increment 31 and value 15 as the modulo 33. It is to note that again all sixteen matrix elements are addressed correctly, but that after the last matrix element $B_{33}$ the addressing algorithm does not jump back to the first matrix element $B_{00}$, but to the fifth matrix element $B_{10}$ which is shown by arrow 49. It is therefore necessary to separately reset the pointer to the first matrix element if more than one matrix multiplication has to be carried out.

Figure 9:
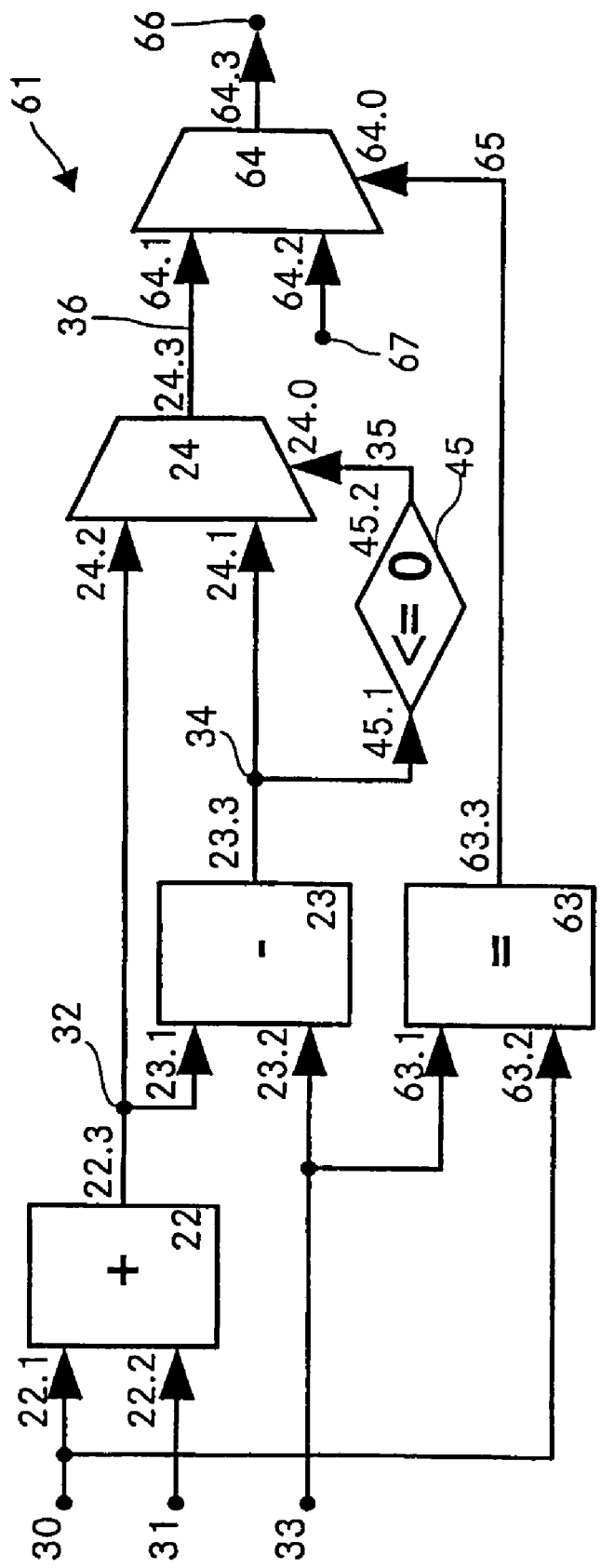
FIG. 9 another modulo arithmetic according to the invention.

FIG. 9 shows another embodiment of the invention having an auto-reset function. AGU 61 therefore allows to repeatedly address all elements of a matrix linearly as well as column by column directly, that is without a separate reset step.

AGU 61 includes all components of AGU 41 as shown in FIG. 6. Therefore, the generation of the output address 36 of MUX 24 is the same as described in connection with FIG. 6. Additionally, AGU 61 includes a comparator 63 and a further multiplexer MUX 64. The comparator 63 serves for testing, whether the input address 30 is equal to or different from the modulo 33. If these two values are different, the output address 66 corresponds to the output address 36 as generated with the AGU 41 of FIG. 6. If the input address 30 and the modulo 33 are equal, the output address 66 is automatically set to the constant value zero 67. Accordingly, with AGU 61 it is not necessary to separately reset the pointer if more than one matrix multiplication has to be carried out.

In detail, the modulo 33 is connected to the first input 63.1 of the comparator 63 and the input address is connected to the second input 63.2. The comparator 63 produces a control signal 65, which is for example high if both inputs are equal and low if the inputs are different. The control signal 65 is outputted at the output 63.3 and is connected to the control input 64.0 of the MUX 64. The output 24.3 of MUX 24 is connected to the first input 64.1 of the MUX 64 and the constant value zero 67 is inputted at a second input 64.2 of the MUX 64. Depending on the value of the control signal 65, the MUX 64 interconnects either the output address 36 at its first input 64.1 (control signal 65 low) or the constant value zero 67 at its second input 64.2 (control signal 65 high) with its output 64.3.

Figure 10:
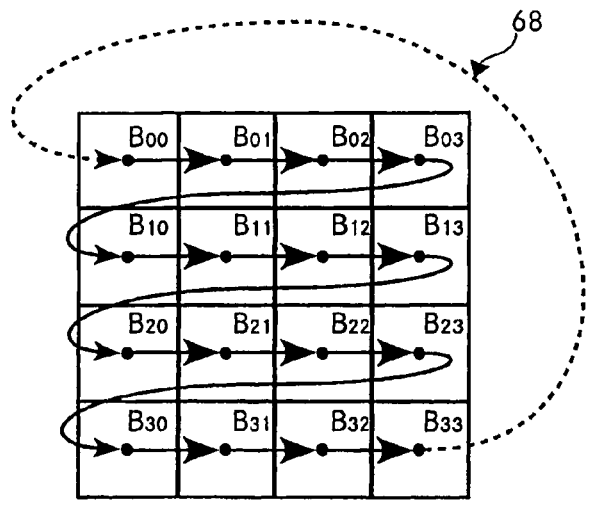
FIG. 10 the addressing order for linear addressing of the elements of the matrix of FIG. 3 with the modulo arithmetic of FIG. 9.
Figure 11:
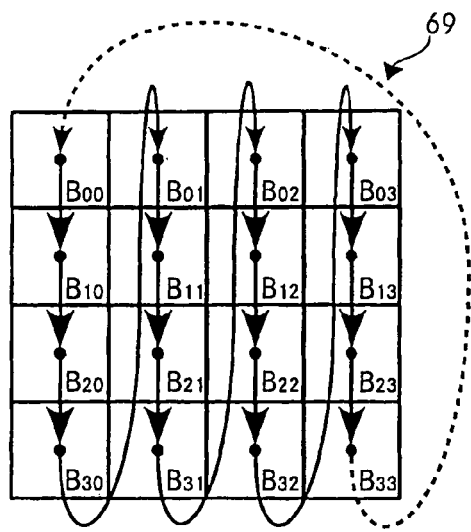
FIG. 11 the addressing order for column by column addressing of the elements of the matrix of FIG. 3 with the modulo arithmetic of FIG. 9.
Figure 13:
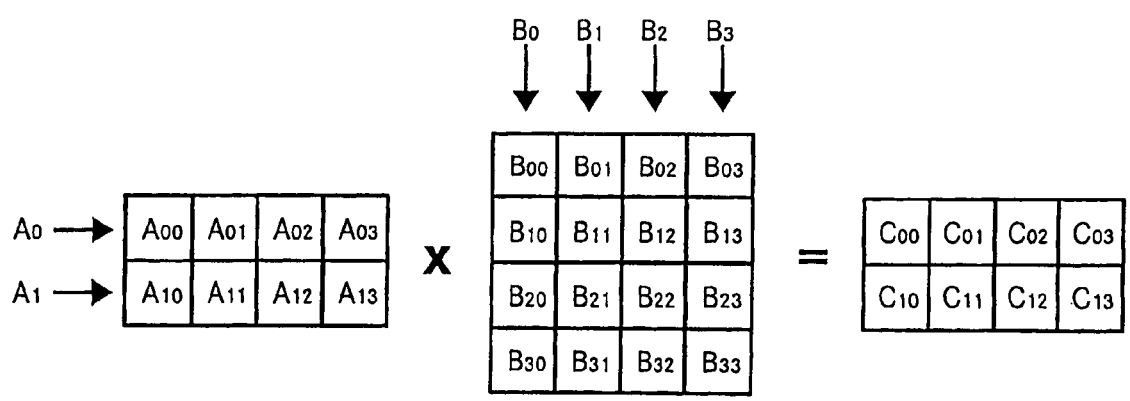
FIG. 13 an illustration of a matrix multiplication.

FIGS. 10 and 11 show the corresponding addressing orders for repeated linear (FIG. 10, value 1 as the increment 31, value 15 as the modulo 33) and column by column (FIG. 11, value 4 as the increment 31, value 15 as the modulo 33) addressing.

The addressing sequence for linear addressing is:

$$0\ 1\ 2\ 3\ 4\ 5\ 6\ 7\ 8\ 9\ 10\ 11\ 12\ 13\ 14\ 15\ 0\ 1 \quad (IX)$$

and the addressing sequence for column by column addressing is:

$$0\ 4\ 8\ 12\ 1\ 5\ 9\ 13\ 2\ 6\ 10\ 14\ 3\ 7\ 11\ 15\ 0\ 4 \quad (X)$$

It can be seen that in both addressing modes the addressing algorithm correctly jumps back to the first memory cell 0 (matrix element $B_{00}$) after the last memory cell 15 (matrix element $B_{33}$). This is shown by the arrow 68 in FIG. 10 and the arrow 69 in FIG. 11.

Figure 12:
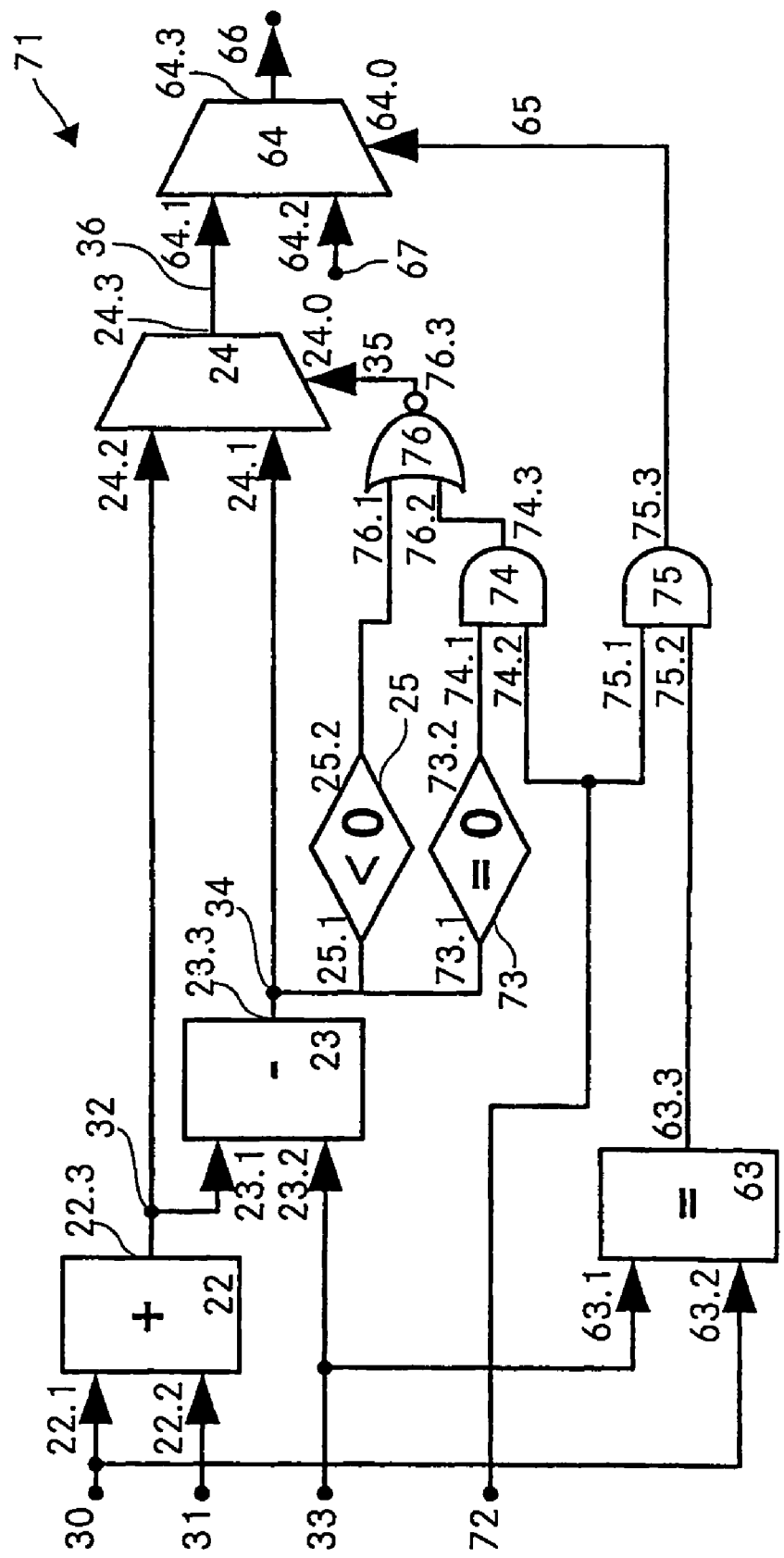
FIG. 12 another modulo arithmetic according to the invention.

FIG. 12 shows an embodiment of the invention that combines the function of the standard modulo as shown in FIG. 1 with the function of the special modulo as shown in FIG. 9. In order to choose one of these two functions, the AGU 71 includes a further input 72. In the example shown, the standard modulo mode as shown in FIG. 1 is chosen by inputting a "low" value, for example a value of "0" at the further input 72. By inputting a "high" value, for example a value of "1" at the further input 72, the AGU 71 produces the addresses according to the special modulo mode as shown in FIG. 9.

AGU 71 is similar to the AGU 61 shown in FIG. 9. The differences are the further input 72, a logic circuit including the AND gates 74, 75 and the NOR gate 76 and that the comparator 45 of FIG. 9 is split into two comparators 25 and 73 to separately check whether the comparison address 34 is lower than zero and whether it is equal to zero.

Accordingly, the comparison address 34 is connected to the input 25.1 of the comparator 25 as well as to the input 73.1 of the comparator 73. The further input 72 is connected to the second input 74.2 of the first AND gate 74 as well as to the first input 75.1 of the second AND gate 75. The output 73.2 of the comparator 73 is connected to the first input 74.1 of the first AND gate 74 and the output 63.3 of the comparator 63 is connected to the second input of the second AND gate 75. Moreover, the output 25.2 of the comparator 25 and the output 74.3 of the AND gate 74 are connected to the two inputs of the NOR gate 76, the output 76.3 of which is connected to the control input 24.0 of the MUX 24 and the output 75.3 of the AND gate 75 is connected to the control input 64.0 of the MUX 64.

In a further embodiment of the invention (not shown) the functions of the AGU 41 as shown in FIG. 6 is combined with the function of AGU 21 as shown in FIG. 1. This combination can be achieved by modifying the AGU 71 of FIG. 12 as follows: the comparator 63, the AND gate 75 and the MUX 64 of AGU 71 are leaved out. So, the further input 72 is only connected to the input 74.2 of the AND gate 74 and the output 24.3 of the MUX 24 directly provides the output address 36. That is for a low input value at the further input this modified AGU generates the addresses as AGU 21 of FIG. 1 and for a high input value at the further input it generates the addresses as AGU 41 of FIG. 6.

It is further to note that the examples shown can be varied in a wide range. It is for example possible to change the test conditions of the comparators. The logic circuit then has to be adapted correspondingly to generate the correct control signals for the multiplexers. And it is certainly possible to change the order of the inputs of some of the components and to change to remaining components accordingly.

In summary, it is to be noted that the invention allows to generate address sequences to directly access the elements of a matrix that is stored in a digital memory row by row, column by column without any additional steps such as resetting the address pointer after the last element of a matrix or jumping to the next column after the last element of a column. Therefore, the invention allows to efficiently generate the address sequences for carrying out matrix operations such as a multiplication of a vector or a matrix with another matrix. Accordingly, these operations can be carried out faster with a minimum of additional resources such as additional space on the substrate of a chip or additional programming.

The invention claimed is:

1. Method for generating an output address for addressing a memory cell of a digital memory including generating a first address by adding an increment to an input address, generating a second address by subtracting a modulo from said first address and generating a third address by selecting said first or said second address in dependency of said second address, characterised in that the method includes selecting said first address as said output address if said second address is lower than or equal to zero and selecting said second address as said output address if said second address is higher than zero, wherein generating said output address includes selecting said third address if said input address is different from said modulo and selecting a constant fourth address if said input address is equal to said modulo.

2. Method according to claim 1, including generating a series of output addresses by executing said method at least twice and using in each case the output address of a $n^{th}$ execution of the method as the input address of a $(n+1)^{th}$ execution of the method and using said series of output addresses for sequentially addressing elements of a matrix in a direction of its columns where said matrix is stored in said digital memory row by row.

3. Device for generating an output address for addressing a memory cell of a digital memory including an adder adapted to generate a first address by adding an increment to an input, a subtractor adapted to generate a second address by subtracting a modulo from said first address, a first multiplexer adapted to generate a third address by selecting said first or said second address in dependency of said second address, characterised in that said first multiplexer is adapted to select said first address as the output address if said second address is lower than or equal to zero and select said second address as the output address if said second address is higher than zero, and a second multiplexer adapted to generate said output address by selecting said third address or a constant fourth address in dependency of said input address and said modulo.

4. Device as claimed in claim 3, wherein a) said adder includes a first input for inputting said input address and a second input for inputting said increment, b) an output of said adder is connected to a first input of said subtractor, c) said subtractor includes a second input for inputting said modulo, d) an output of said subtractor is connected to a first input of said first multiplexer, e) the output of said adder is connected to a second input of said first multiplexer, f) said output of said subtractor is connected to an input of a first comparator and g) an output of said first comparator is connected to a control input of said first multiplexer.

5. Device as claimed in claim 4, further including a second comparator for deciding whether said input address is equal to or different from said modulo, wherein said second multiplexer is adapted to select said third address as the output address if said input address is different from said modulo and said second multiplexer is adapted to select said constant fourth address as the output address if said input address is equal to said modulo where selecting said constant fourth address includes selecting a value of zero as the output address.

6. Device as claimed in claim 5 wherein a) said second comparator includes a first input for inputting said modulo and a second input for inputting said input address, b) an output of said second comparator is connected to a control input of said second multiplexer, c) an output of said first multiplexer is connected to a first input of said second multiplexer, d) said constant fourth address is connected to a second input of said second multiplexer,
e) and said second multiplexer includes an output for outputting said output address.

7. Device as claimed in claim 6, wherein said device is adapted to generate said output address by
   selecting said first address as the output address if a value of a first given set of values is inputted at a further input of the device and if said second address is lower than zero,
   selecting said second address as the output address if a value of said first given set of values is inputted at the further input and if said second address is higher than or equal to zero,
   selecting said first address as the output address if a value of a second given set of values is inputted at the further input and if said second address is lower than or equal to zero,
   selecting said second address as the output address if a value of said second given set of values is inputted at the further input and if said second address is higher than zero,
   where said first given set of values particularly includes the value of zero and where said second given set of values particularly includes the value of one.

8. Device as claimed in claim 7, wherein
   a) said output of said subtractor is further connected to an input of a third comparator,
   b) an output of said third comparator is connected to a first input of a first AND gate,
   c) said further input of the device is connected to a second input of the first AND gate,
   d) the output of the first comparator is connected to a first input of a NOR gate,
   e) an output of said first AND gate is connected to a second input of the NOR gate and
   f) an output of the NOR gate is connected to said control input of the first multiplexer.

9. Device as claimed in claim 8, wherein said device is adapted to generate said output address by
   a) selecting said first address as the output address if a value of a second given set of values is inputted at the further input and if said second address is lower than or equal to zero and if said input address is different from said modulo,
   b) selecting said second address as the output address if a value of said second given set of values is inputted at the further input and if said second address is higher than zero and if said input address is different from said modulo,
   c) selecting a constant fourth address as the output address if a value of said second given set of values is inputted at the further input and if said input address is equal to said modulo and wherein
   d) said further input of the device is further connected to a first input of a second AND gate,
   e) an output of said second comparator is connected to a second input of the second AND gate and
   f) an output of the second AND gate is connected to the control input of the second multiplexer.

10. Device as claimed in claim 3, wherein said device is adapted to generate said output address by
    a) selecting said first address as the output address if a value of a first given set of values is inputted at a further input of the device and if said second address is lower than zero,
    b) selecting said second address as the output address if a value of said first given set of values is inputted at the further input and if said second address is higher than or equal to zero,
    c) selecting said first address as the output address if a value of a second given set of values is inputted at the further input and if said second address is lower than or equal to zero,
    d) selecting said second address as the output address if a value of said second given set of values is inputted at the further input and if said second address is higher than zero,
    e) where said first given set of values particularly includes the value of zero and where said second given set of values particularly includes the value of one.

11. Device as claimed in claim 10, wherein said device is adapted to generate said output address by
    a) selecting said first address as the output address if a value of a second given set of values is inputted at the further input and if said second address is lower than or equal to zero and if said input address is different from said modulo,
    b) selecting said second address as the output address if a value of said second given set of values is inputted at the further input and if said second address is higher than zero and if said input address is different from said modulo,
    c) selecting a constant fourth address as the output address if a value of said second given set of values is inputted at the further input and if said input address is equal to said modulo.

12. Integrated circuit, particularly an integrated circuit of a digital signal processor (DSP), including a device as claimed in claim 3.

13. Listening devices, particularly a hearing aid, including an integrated circuit as claimed in claim 12.

* * * * *

UNITED STATES PATENT AND TRADEMARK OFFICE
CERTIFICATE OF CORRECTION

PATENT NO. : 7,631,164 B2  Page 1 of 1
APPLICATION NO. : 11/488663
DATED : December 8, 2009
INVENTOR(S) : Marc Matthey It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 312 days.

Signed and Sealed this

Second Day of November, 2010

David J. Kappos
*Director of the United States Patent and Trademark Office*